United States Patent [19]
Kodama et al.

[11] Patent Number: 5,629,834
[45] Date of Patent: May 13, 1997

[54] ELECTRONIC COMPONENT COOLING APPARATUS

[75] Inventors: Nobumasa Kodama, Ueda; Toshiki Ogawara, Chiisagata-gun, both of Japan

[73] Assignee: Sanyo Denki Co., Ltd., Tokyo, Japan

[21] Appl. No.: 208,125

[22] Filed: Mar. 9, 1994

[30] Foreign Application Priority Data

Aug. 20, 1993 [JP] Japan .................. 5-206198
Dec. 28, 1993 [JP] Japan .................. 5-334392

[51] Int. Cl.⁶ .................................. H05K 7/20
[52] U.S. Cl. .......... 361/695; 165/80.3; 165/122; 165/185; 174/16.3; 415/176; 415/178
[58] Field of Search ................ 165/80.3, 185, 165/122, 124, 126; 257/722, 718–719, 726–727; 310/62–64, 67 R, 71; 361/694–697; 415/175–178, 213.1, 214.1, 220

[56] References Cited

U.S. PATENT DOCUMENTS

| | | | |
|---|---|---|---|
| 3,700,358 | 10/1972 | Papst et al. | 310/67 R |
| 4,465,948 | 8/1984 | Oyama et al. | 310/62 |
| 4,698,542 | 10/1987 | Muller | 310/67 R |
| 5,002,123 | 3/1991 | Nelson et al. | 165/80.3 |
| 5,019,880 | 5/1991 | Higgins, III | 165/80.3 |
| 5,021,696 | 6/1991 | Helsch | 310/62 |
| 5,288,203 | 2/1994 | Thomas | 361/694 |
| 5,309,983 | 5/1994 | Bailey | 174/16.3 |

FOREIGN PATENT DOCUMENTS 15982  3/1991  Japan .

OTHER PUBLICATIONS

Electronic Buyer's News, Oct. 26, 1992 –Advertisement and 8 Photographs.
ICECAP 4, Nov. 28, 1992 –Leaflet.
KPI Key Power Inc., Nov. 28, 1992 –Leaflet.
JP Utility Model Laid–Open Publication No. 113460/1988, Jul. 21, 1988.

*Primary Examiner*—Gregory D. Thompson
*Attorney, Agent, or Firm*—Pearne, Gordon, McCoy & Granger

[57] ABSTRACT

An electronic component cooling apparatus capable of permitting a heat sink to exhibit satisfactory cooling efficiency and increasing durability of a motor. A plurality of radiation fins are provided on a base of a heat sink in a manner to surround an impeller including blades and fixed on a rotor of a motor. The radiation fins are arranged so as to be in conformity to a direction of flowing of air from the impeller being rotated. The blades each are constructed so as to permit air to be sucked in from a side of webs and discharged through an air passage defined between each adjacent two of the radiation fins.

11 Claims, 4 Drawing Sheets

ELECTRONIC COMPONENT COOLING APPARATUS

BACKGROUND OF THE INVENTION

This invention relates to an electronic component cooling apparatus, and more particularly to an apparatus for cooling electronic components incorporated in an electronic appliance such as a microprocessor unit (MPU) or the like.

Recently, a microprocessor tends to be increased in integration in order to enhance performance thereof. Unfortunately, this causes generation of heat from the microprocessor to be substantially increased, so that cooling of the microprocessor is required. In order to solve the problem, an electronic component cooling apparatus is employed for forcibly cooling the microprocessor.

Now, such an electronic component cooling apparatus which has been conventionally used for this purpose will be described by way of example of a heat sink integrated fan with reference to FIG. 8.

A heat sink integrated fan shown in FIG. 8 includes a motor 201 of the rotor out-rotation type. The words "motor of the rotor out-rotation type" used herein indicates a motor so constructed that a rotor is rotated outside a stator. The fan also includes an impeller 202 provided with a plurality of blades 203 and fixed on the rotor. Reference numeral 204 designates a casing arranged so as to surround the motor 201, 205 is webs for interconnecting a housing 201A of the motor and the casing 204, 206 is a heat sink provided with a plurality of radiation fins 207 so as to form a recess therein in which a part of the impeller 202 is received. In general, the impeller 202 is received at a portion thereof accounting for about one third of the whole impeller in the recess. In the fan thus constructed, the radiation fins 207 are arranged so as to surround the impeller 202 and in a manner to be perpendicular to each of sides of the casing 204. The blades 203 provided at the impeller 202 function to suck in air from a side of the heat sink 206 and discharge it to a side of the web 205.

The construction of the conventional cooling apparatus that air is sucked in from the side of the heat sink 206 and then discharged to the side of the webs 205 causes the heat sink 206 to act as an obstacle to an air suction side of the fan, leading to a deterioration in ventilation efficiency and cooling performance of the cooling apparatus. Also, the conventional cooling apparatus causes air heated by heat discharged from the heat sink 206 to flow to surroundings of the motor 201, so that an interior of the motor 201 is increased in temperature to reduce durability of the motor.

Further, the conventional electronic component cooling apparatus, as described above, is so constructed that the radiation fins 207 are arranged so as to be perpendicular to each of the sides of the casing 204 irrespective of flowing of air. Such construction fails to permit a sufficient amount of air to be fed to surroundings of the radiation fins 207, resulting in a need to substantially increase the radiation area of the fins.

SUMMARY OF THE INVENTION

The present invention has been made in view of the foregoing disadvantages of the prior art.

Accordingly, it is an object of the present invention to provide an electronic component cooling apparatus which is capable of permitting a heat sink to exhibit enhanced cooling efficiency and increasing the durability of the motor.

It is another object of the present invention to provide an electronic component cooling apparatus which is capable of significantly reducing an overall height thereof.

It is a further object of the present invention to provide an electronic component cooling apparatus which is capable of reducing generation of noise.

It is still another object of the present invention to provide an electronic component cooling apparatus which is capable of facilitating mounting of the apparatus on an electronic appliance.

It is yet another object of the present invention to provide an electronic component cooling apparatus which is capable of being simplified in structure and facilitating the assembling.

In accordance with the present invention, an electronic component cooling apparatus is provided. The apparatus includes a motor of the rotor out-rotation type in which a rotor is rotated outside a stator and which includes a housing, an impeller including a plurality of blades and fixed on the rotor, a casing arranged so as to surround the motor, a plurality of webs for interconnecting the housing of the motor and the casing, and a heat sink including a base provided thereon with a plurality of radiation fins and fixed on the casing; wherein the radiation fins are arranged so as to surround at least a part of the impeller, the blades of the impeller are arranged so as to suck in air from a side of the webs and discharge it toward the radiation fins, and the radiation fins are arranged so as to define an air passage between each adjacent two of the radiation fins for outwardly guiding air from the impeller therethrough.

Thus, the present invention permits a sufficient amount of air to be fed to surroundings of the radiation fins, leading to an improvement in cooling performance.

In a preferred embodiment of the present invention, the blades each have an upper edge defined on the side of the webs so as to be gradually away from the webs as it extends in an outward direction from the impeller. Such construction substantially restrains the webs from causing generation of noise due to rotation of the blades through air during suction of air from the side of the webs.

In order to increase a radiation area of the radiation fins to improve radiation efficiency thereof, it would be preferable to increase a height of the radiation fins as much as possible. However, an excessive increase in height of the radiation fins not only causes generation of noise of an increased level during suction of air from the side of the webs but rather deteriorates cooling efficiency. This is due to the fact that an excessive increase in height of the radiation fins causes air to be sucked in from an outside of the radiation fins, particularly, the outside thereof facing the casing to an interior thereof. Air thus sucked in from the outside of the radiation fins collides with air sucked in from the side of the webs to cause generation of noise and reduce a velocity of the latter air to deteriorate cooling efficiency. In view of the foregoing, in a preferred embodiment of the present invention, the radiation fins each are arranged so as to vertically extend from the base of the heat sink to a position below the upper edge of the blade. Such construction minimizes sucking of air from the outside of the radiation fins, particularly, the outside thereof facing the casing, to thereby minimize generation of noise and deterioration in cooling efficiency.

In a preferred embodiment of the present invention, the impeller includes a cup-like member having the blades mounted on the outer periphery thereof. In general, air between the cup-like member of the impeller and the base of the heat sink is hard to be moved irrespective of rotation of the impeller, leading to a failure in effective cooling of the base of the heat sink opposite to the cup-like member of the impeller. In order to avoid the disadvantage, the cup-like member is preferably provided at a portion thereof opposite to the base with a plurality of ribs for air agitation, so that the air may be effectively agitated to enhance cooling performance.

In a preferred embodiment of the present invention, the ribs each are arranged so as to correspond to each of the blades and extend from a central region of the cup-like member to a lower edge of the corresponding blade. This accomplishes not only agitation of air but smooth discharge of the agitated air, to thereby further promote an improvement in cooling performance.

In a preferred embodiment of the present invention, the radiation fins each include a first section arranged so as to be opposite to a lower edge of each of the blades facing the base of the heat sink and a second section arranged outside the blades. Such construction contributes to an improvement in cooling efficiency.

In a preferred embodiment of the present invention, the radiation fins each are formed into a configuration which permits two virtual planes of the radiation fin defined by inwardly extending both side surfaces thereof defined in a longitudinal direction thereof to intersect each other in an inner space surroundedly defined by the radiation fins. This reduces resistance of the radiation fins to an air stream fed from the impeller, to thereby enhance radiation efficiency and minimize generation of noise.

In a preferred embodiment of the present invention, the base of the heat sink is formed into a contour of a substantially square shape, wherein the base is provided at each of corners thereof positioned on one of diagonal lines of the base with a pillar so as to be integral therewith and the casing is threadedly mounted through the pillars on the base. Such construction facilitates assembling of the apparatus and increase the radiation area of the radiation fins.

Also, in accordance with the present invention, an electronic component cooling apparatus is provided. The apparatus includes a motor including a rotor and a stator and received in a housing, an impeller including a plurality of blades and fixedly mounted on the rotor, a frame-like casing for fixing the rotor therein, a plurality of webs for interconnecting the housing of the motor and the casing, and a heat sink including a base on which the radiation fins each are arranged so as to substantially radially extend and terminate at an inner end thereof at an intermediate portion of the base; wherein the heat sink is fixed to the casing, the radiation fins are disposed so as to permit a recess to be surroundedly defined by the inner ends of the radiation fins at a central region of the base, in which recess a part of the impeller is received, the radiation fins are arranged so as to permit an air passage to be defined between each adjacent two of the radiation fins, the blades are arranged so as to suck in air from a side of the webs and discharge it through the air passages of the radiation fins, and the casing includes a connector section provided with a plurality of terminals to which power required for at least driving of the driving of the motor is fed.

Arrangement of the connector section provided with the plural terminals permits the apparatus of the present invention to be mounted on an electronic appliance without considering any wiring cord and facilitates disconnection of the apparatus from the appliance when any failure occurs in the apparatus. The connector section may be positioned at a corner of the casing at which a threaded mounting means is not provided, so that an operation of mounting the casing through may be executed without being disturbed by the connector section.

In a preferred embodiment of the present invention, the casing includes a base section formed into substantially the same contour of the base of the heat sink and contacted with the radiation fins and a cylindrical section mounted on the base section so as to surround a part of the impeller, wherein the connector section is positioned at the cylindrical section. This permits the connector section to be arranged without substantially projecting it to the outside of the base section.

Thus, the electronic component cooling apparatus of the present invention is so constructed so as to suck in air from the side of the webs and discharge it through the passages each defined between each adjacent two radiation fins. Such construction eliminates formation of any obstacle on the suction side, to thereby increase air feed efficiency, resulting in enhancing cooling performance. Also, the present invention effectively prevents the motor from being exposed to air heated by the heat sink to prevent excessive increase in temperature in the motor, to thereby improve durability of the motor.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENTS

Now, an electronic component cooling apparatus according to the present invention will be described hereinafter with reference to the accompanying drawings.

Figure 1:
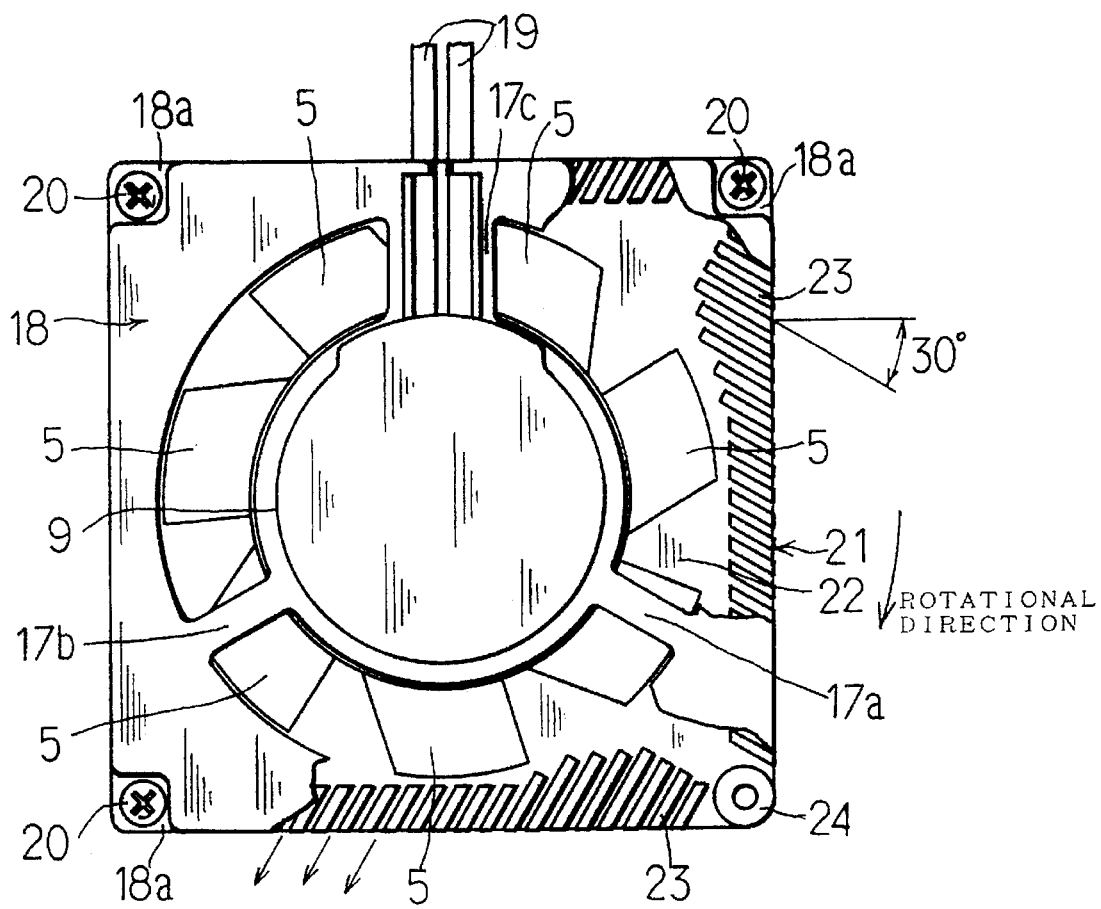
FIG. 1 is a partially cutaway front elevation view showing an embodiment of an electronic component cooling apparatus according to the present invention.
Figure 2:
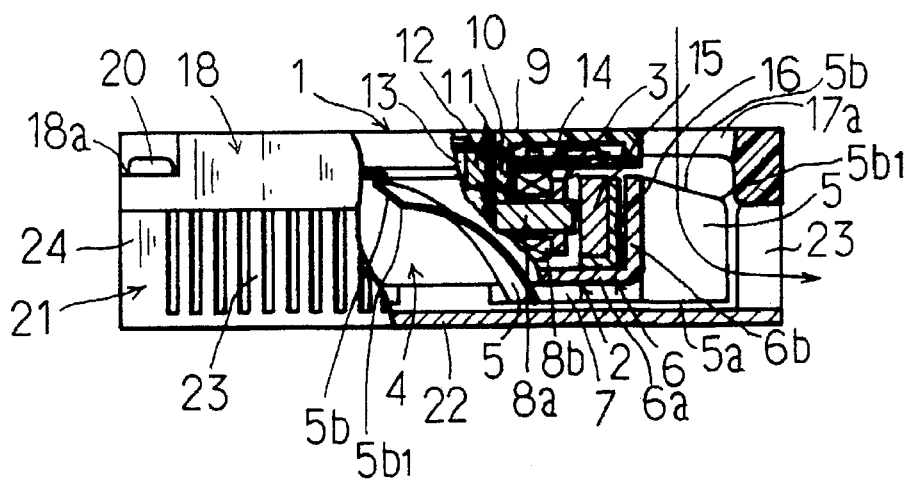
FIG. 2 is a partially cutaway side elevation view of the electronic component cooling apparatus shown in FIG. 1.
Figure 3:
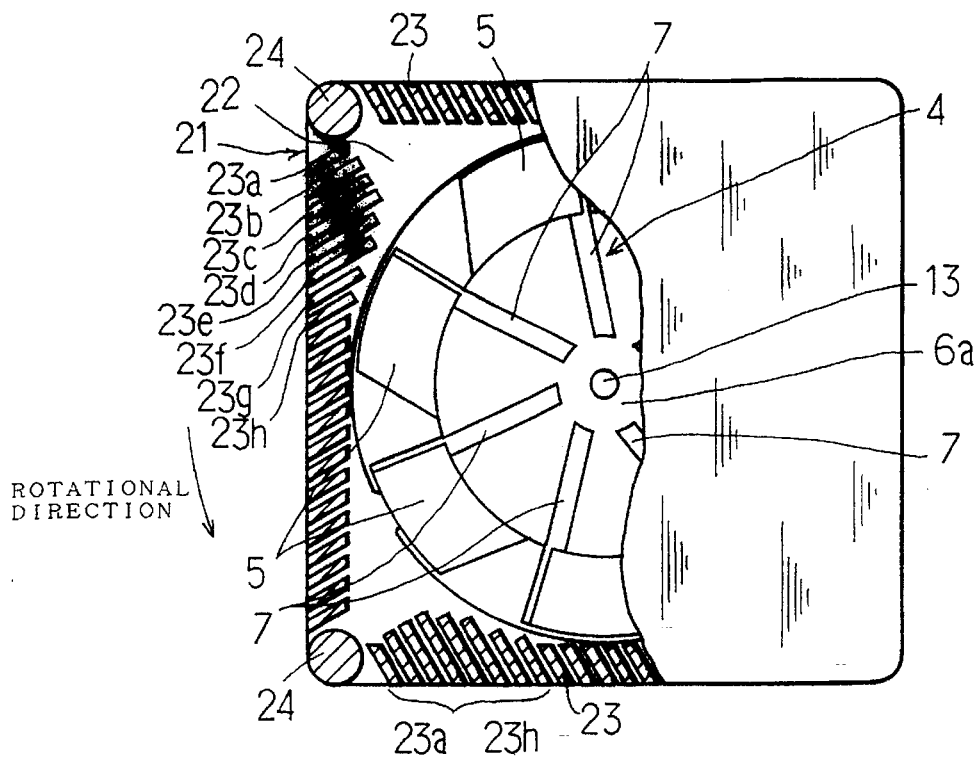
FIG. 3 is a partially cutaway rear elevation view of the electronic component cooling apparatus shown in FIG. 1.

Referring first to FIGS. 1 to 3, an embodiment of an electronic component cooling apparatus according to the present invention is illustrated. In FIGS. 1 to 3, reference numeral 1 designates a motor of the rotor out-rotation type including a rotor 2 and a stator 3 wherein the rotor 2 is rotated outside the stator 3. 4 is an impeller including a cup-like member 6 of which a peripheral wall 6b is fixedly mounted thereon with seven blades 5 and of which a bottom wall 6a is fixedly mounted thereon with seven air agitating ribs 7. The impeller 4 is integrally formed of a synthetic resin material such as polybutylene terephthalate or the like.

In the illustrated embodiment, a two-phase brushless DC motor is used as the motor 1. The stator 3 of the motor 1, as shown in FIG. 2, includes an iron core 8a and an exciting coil 8b wound on the core 8a and is fixed on a boss 10 of a cylindrical shape arranged at a central portion of a housing 9. The boss 10 of the housing 9 is fitted thereon with a bearing holder 11, in which a pair of bearings 12 are housed so as to be spaced from each other in an axial direction of the holder 11. In FIG. 2, only one of the bearings 12 is shown for the sake of brevity. Reference numeral 13 is a revolving shaft of which one end is rotatably supported by the bearings 12 and the other end is fitted in a hole formed at the bottom wall 6a of the cup-like member 6 as shown in FIG. 3. The housing 9 is also fixedly mounted thereon with a circuit board 14 on which electronic elements constituting a drive circuit are mounted. The cup-like member 6 is securely mounted on an inner peripheral surface of a peripheral wall 6b thereof with a ring 16 of magnetic permeability which has a plurality of magnetic poles 15 each comprising a permanent magnet supported on an inner peripheral surface thereof. Thus, the rotor 2 is constituted by the cup-like member 6, magnetic poles 15 and magnetically-permeable ring 16.

The housing 9 of the motor 1 is connected to a casing 18 which is formed into a contour of a rectangular or square shape and provided on a periphery thereof with a vertically extending peripheral wall of a predetermined length. In the illustrated embodiment, the housing 9, webs 17a, 17b and 17c and casing may be formed of a synthetic resin material such as polybutylene terephthalate in a manner to be integral with each other. The webs 17a to 17c are arranged so as to be spaced from each other at angular intervals of about 120degrees. Of the webs 17a to 17c, the web 17c is constructed so as to guide a cord 19 therethrough. The casing 18 is formed at each of corners thereof with a through-hole (not shown) via which a mounting screw 20 is inserted. Also, the casing 18 is formed at at each corner at each of the through-holes with a recess 18a in which the head of the mounting screw 20 is received. The peripheral wall of the casing 18, as shown in FIG. 2, is formed into a vertical length or height larger than a thickness of the webs 17a to 17c, to thereby partially surround an outer periphery of the impeller 4. More specifically, the peripheral wall of the casing 18 is formed into a vertical dimension sufficient to extend to a position lowered by about 1.5 to 2.5 mm toward the heat sink 21 based on an outer end 5b1 of an upper edge 5b of each blade 5 facing each of the webs 17a, 17b and 17c. Such configuration restrains air from being sucked in from an outside of the radiation fins 23, particularly, the outside thereof facing the casing, to thereby minimize generation of noise and avoid a reduction in cooling efficiency.

The blades 5 provided on an outer periphery of the peripheral wall of the cup-like member 6 are arranged so as to suck in air from the side of the webs 17a, to 17b and 17c and discharge it through a passage defined between each adjacent two radiation fins 23 provided on the base 22 of the heat sink 21. The blades 5 each has a lower edge 5a formed and arranged in a manner to be opposite to a surface of the base 22 of the heat sink 21. The lower edge 5a of each of the blades 5 is arranged so as to downwardly extend beyond the bottom wall 6a of the cup-like member 6. In the illustrated embodiment, a gap between the surface of the base 22 of the heat sink 21 and each of the lower edge 5a of the blade 5 and a gap between the surface of the base 22 and a lower end of the rib 7 each are defined to be about 1 mm. Setting of the gap at a dimension of 2 mm or less causes a velocity of air flowing along or across the surface of the base 22 to be increased. In the illustrated embodiment, the upper edge 5b of each of the blades 5 is formed so as to slope downwardly gradually away from the wall 6b as it extends outwardly toward the radiation fins 23. This arrangement of the blades 5 substantially prevents the webs from causing generation of noise due to rotation of the blades through air during suction of air from the side of the webs, even when the fan is decreased in thickness.

The ribs 7 for air agitation which are provided on the outer surface of the bottom wall 6a of the cup-like member 6 are arranged in alignment with the blades 5. Also, the ribs 7 each are substantially radially arranged and formed so as to laterally or horizontally extend from a central region of the cup-like member 6 to the lower edge 5a of the corresponding blade 5. In the illustrated embodiment, the ribs 7 each are so formed that the inner end thereof terminates at a spaced distance from the shaft 13, resulting in the central region of the cup-like member 6 being free of any ribs. Such arrangement and formation of the ribs permit air to smoothly flow across the surface of the base 22 of the heat sink 21. When it is merely required to agitate air, arrangement of the ribs 7 in alignment with the blades 5 may be eliminated. In this instance, at least one rib which is formed into a suitable shape and a suitable length may be arranged on the bottom wall 6a of the cup-like member 6.

The heat sink 21 includes the base 22 of a plate-like shape and the plural radiation fins 23 integrally formed on the base 22. The heat sink 21 is integrally made of a metal material of increased thermal conductivity such as aluminum or the like. The base 22 is formed into a square profile and provided at each of corners thereof with a pillar 24 formed with a threaded hole into which the mounting screw 20 is threadedly inserted for mounting the casing 18 on the base 22. The radiation fins 23 are arranged on a periphery of the base 22 so as to upwardly extend therefrom, to thereby surround an outer periphery of the impeller 4. The radiation fins 23 are preferably arranged so as to outwardly guide air fed or discharged from the impeller 4 being rotated. Further, in the illustrated embodiment, the radiation fins 23 each are formed so as to extend to a position adjacent the upper edge 5b of each of the blades 5.

The direction in which air flows out of the impeller 4 is varied depending on the rotational position. Thus, the radiation fins 23 each are desirably arranged so as to permit air to flow along a surface of each of the fins while keeping flowing of air optimum. In the illustrated embodiment, the radiation fins 23 each are arranged at an angle of about 30 degrees based on a line perpendicular to each of sides of the base 22. An angle of about 30 degrees is suitable when the rotational speed of the impeller 4 is within a range of 4000 to 6000 rpm. When the rotational speed is increased above and reduced below the range, the angle is increased and decreased correspondingly, respectively.

In the illustrated embodiment, of the radiation fins 23 arranged along each of the sides of the base 22, radiation fins 23a to 23h (FIG. 3) positioned rearwardly on the basis of a direction of rotation of the impeller 4 or a direction indicated at an arrow in FIGS. 1 and 3 each have a length defined so as to permit an envelope defined by connecting inner ends of the fins 23a to 23h to each other to be inwardly protruded. The remaining radiation fins 23 positioned forwardly on the basis of the direction of rotation of the impeller 4 each are formed into a length which permits an envelope defined by connecting inner ends of the fins to be substantially linear. Supposing that each side of the base 22 is set to be 45 mm and the gap between each adjacent two radiation fins is set to be 0.7 mm, the radiation fins 23a to 23h may be formed into lengths of 3.3 mm, 4.5 mm, 5.3 mm, 6.1 mm, 5.9 mm, 5.7 mm, 4.5 mm and 3.8 mm, respectively. The remaining radiation fins 23 each may be formed into a constant length of 3.3 mm. The convex contour defined by cooperation of the radiation fins 23a to 23h permits a radiation area thereof to be significantly increased while ensuring smooth flowing of air out of the impeller 4. Also, in the illustrated embodiment, the remaining radiation fins positioned forwardly on the basis of the direction of rotation of the impeller 4, as described above, are arranged so as to cause the envelope defined by connecting the inner ends thereof together to be substantially linear. Such arrangement is for the purpose of ensuring smooth flowing of air into the gap between each adjacent two radiation fins.

Figure 8:
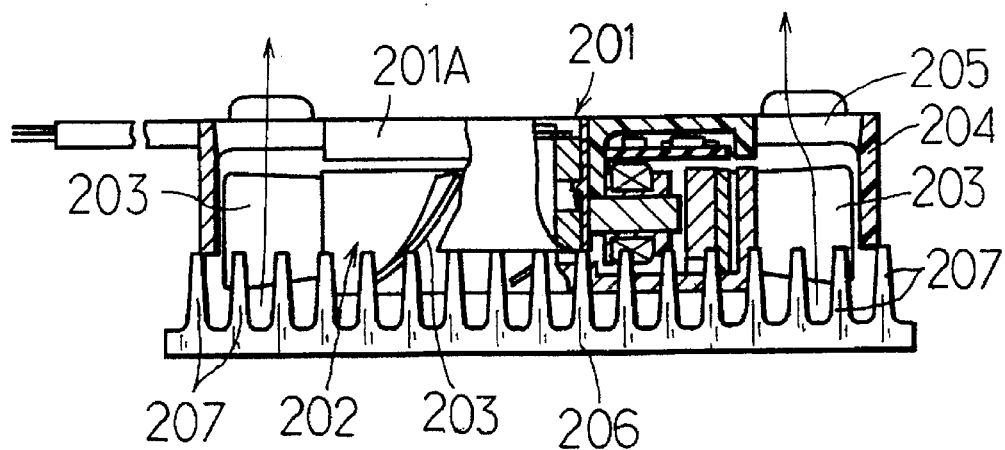
FIG. 8 is a partially cutaway sectional view showing a conventional heat sink integrated fan.

An electronic component cooling apparatus of the present invention which has dimensions of 45 mm×45 mm×12 mm was prepared according to the illustrated embodiment constructed as described above and then subject to a cooling performance test while placing a 10 W heating model on a heat sink 21 under conditions that a rotational speed of an impeller 4 is set to be 6000 rpm and an ambient temperature is set at 25° C. As a result, the heating model was increased in temperature by 17° C. For comparison, the conventional fan constructed in such a manner as shown in FIG. 8 was subject to the same test under the same conditions. As a result, it was found that an increase in temperature of the heating model is 39° C. The same test was carried out on a heat sink integrated fan commercially available and, as a results, an increase in temperature of the heating model was 20° C. or more.

The illustrated embodiment, as described above, is so constructed that, of the plural radiation fins arranged on each of the sides of the base of the heat sink which is formed into a square contour, the radiation fins positioned rearwardly on the basis of the direction of rotation of the impeller each are formed into a length which permits the envelope defined by connecting the inner ends of the radiation fins to each other to be inwardly projected or convex. Such construction permits a radiation area of the radiation fins to be significantly increased to enhance cooling performance of the apparatus while ensuring smooth flowing of air out of the impeller. Also, the illustrated embodiment reduces a vertical dimension or height of the casing to permit a large part of the radiation fins to surround the impeller, resulting in a whole height of the apparatus being substantially decreased.

In the illustrated embodiment, the radiation fins 23 are obliquely arranged at the same angle to each side of the base 22. Alternatively, they may be arranged at angles different as required. Also, the radiation fins 23 each are formed so as to linearly extend in a longitudinal direction thereof. Alternatively, they may be curved in conformity to flowing of air.

Figure 6:
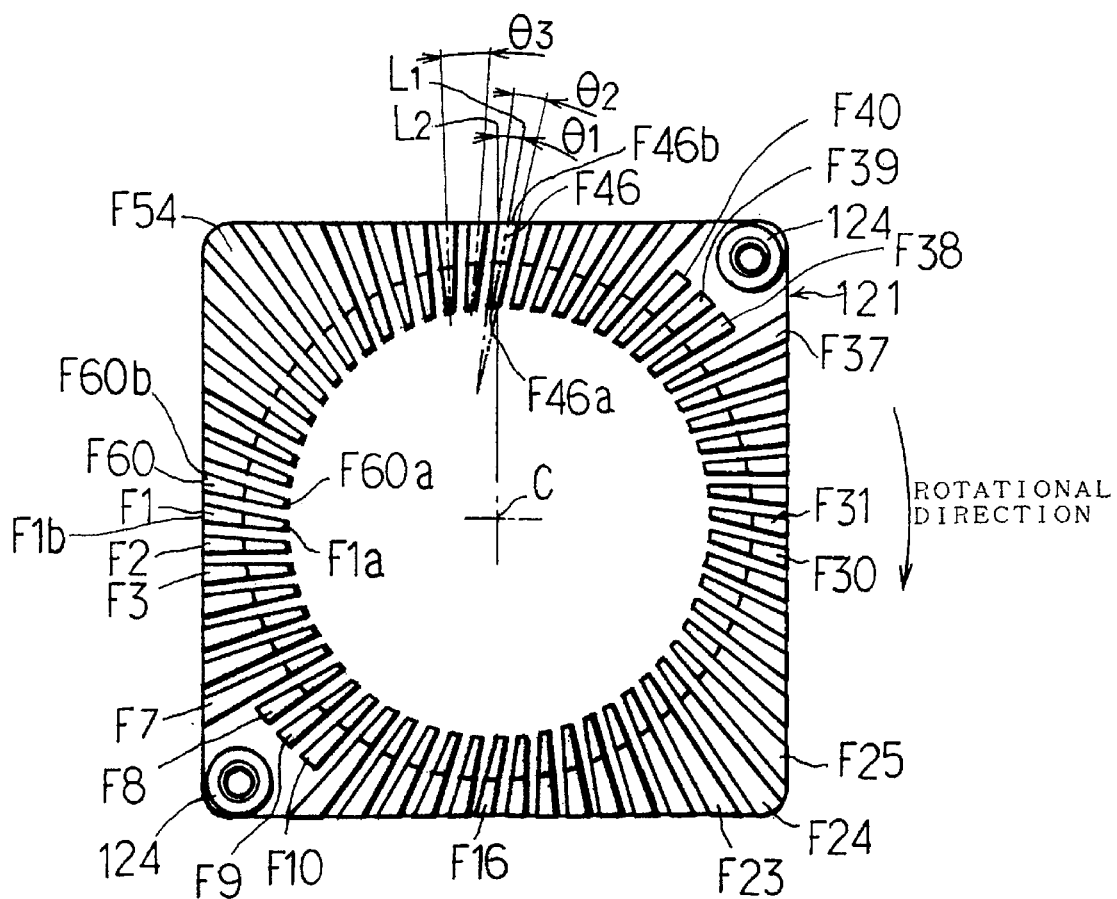
FIG. 6 is a plan view showing a heat sink.
Figure 7:
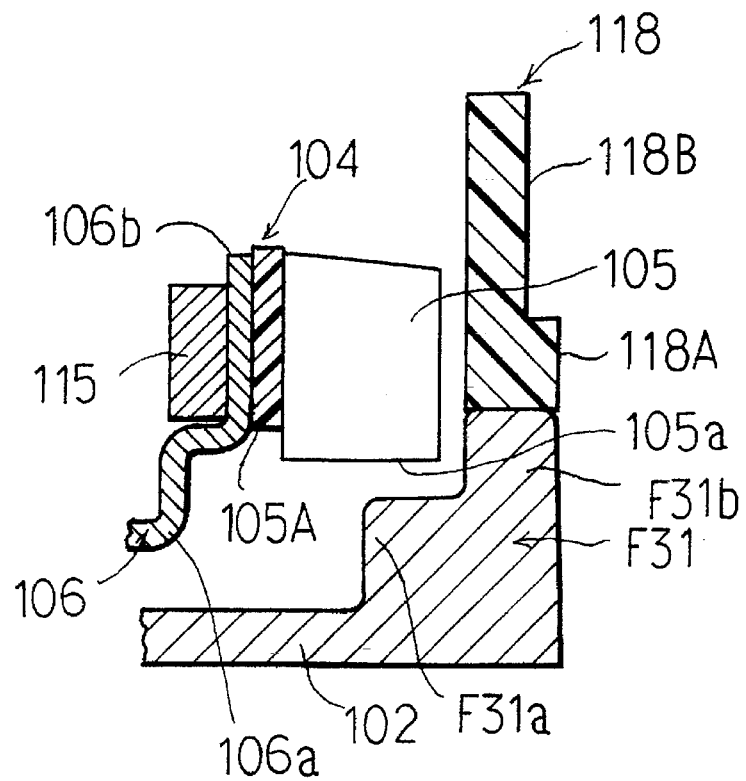
FIG. 7 is a sectional view taken substantially along line VII—VII of FIG. 4.

Referring now to FIGS. 4 to 7, another embodiment of an electronic component cooling apparatus according to the present invention is illustrated. In FIGS. 4 to 7, parts in the illustrated embodiment corresponding to those in the above-described embodiment are designated at reference numerals represented by adding one hundred to reference numerals used for indicating the parts in the above-described embodiment. The embodiment shown in FIGS. 4 to 7 is constructed in a way substantially different in the configuration of the casing, configuration and arrangement of radiation fins and the number of pillars from the embodiment described above with reference to FIGS. 1 to 3. Also, the illustrated embodiment has a connector section incorporated therein unlike the above-described embodiment. More particularly, in the illustrated embodiment, a casing 118 is formed into substantially the same contour as that of a base 122 of a heat sink 121 and includes a base section 118A contacted with a plurality of radiation fins F1 to F60 and a cylindrical section 118B integrally mounted at one end thereof on an upper surface of the base section 118A and arranged so as to surround a part of an impeller. The cylindrical section 118B of the casing 118 is mounted thereon with a connector section 125 in a manner to be positioned above one of corners of the base section 118A. The base section 118A is formed at the corner thereof positioned below the connector section 125 with a cutout 118A1, so that radiation fins F23 to F25 are partially exposed at the cutout. Also, the base section 118A is formed at each of corners thereof positioned on one of diagonal lines thereof with a through-hole (not shown) into which a mounting screw 120 is threadedly inserted. The casing 118 is arranged so as to surround a portion of each of blades 100 corresponding to about three fourths as large as a whole height of the blade as shown in FIG. 7. Thus, the cylindrical section 118B accounts for a large part of an air duct for the impeller 104. Such construction causes a height of the apparatus of the illustrated embodiment to be increased as in the conventional apparatus shown in FIG. 8. However, it permits the plural radiation fins F1 to F60 of the heat sink 121 to extend to a lower portion of the blade 105, to thereby enhance cooling efficiency of the apparatus.

Figure 4:
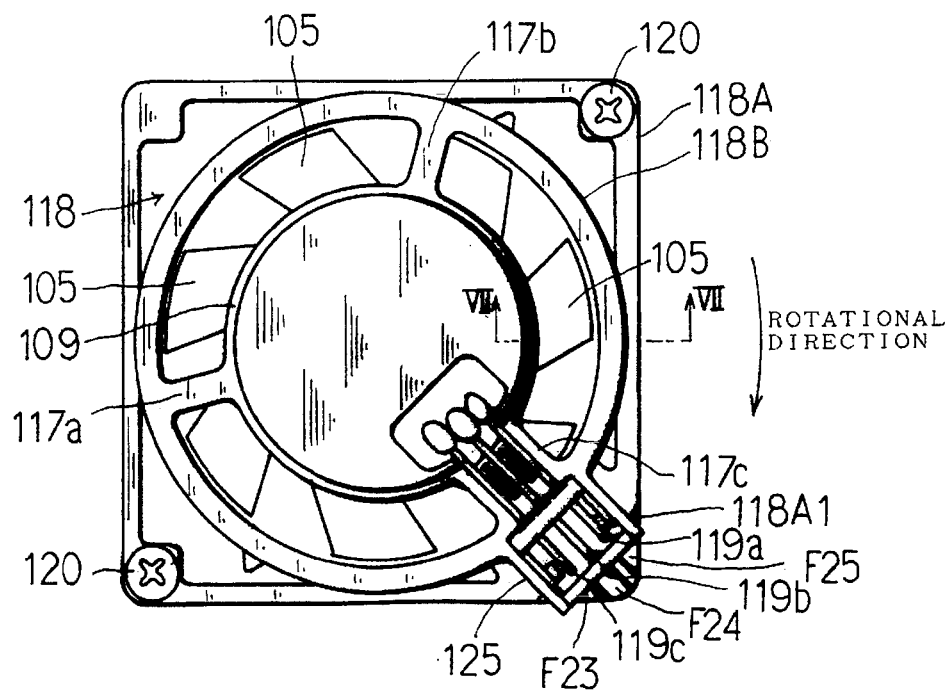
FIG. 4 is a plan view showing another embodiment of an electronic component cooling apparatus according to the present invention.
Figure 5:
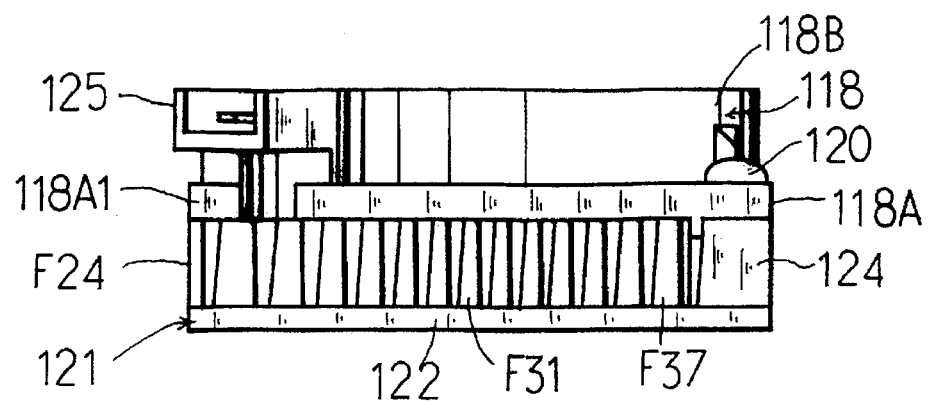
FIG. 5 is a right side elevation view of the electronic component cooling apparatus shown in FIG. 4.

The connector section 125 integrally mounted on the corner of the cylindrical section 118B of the casing 118 so as to be positioned opposite to the heat sink 121 is constructed into a male connector structure. The connector section 125 includes pin terminals 119a and 119b which act as positive and negative terminals for power feed, respectively. The connector section 125 also includes a pin terminal 119c which acts as a signal output terminal for outputting a signal indicating stoppage of a motor. In FIG. 4, an end cover of a housing 109 of the motor is removed for clearly indicating mounting of the pin terminals.

Now, a construction of the heat sink 121 will be described hereinafter with reference to FIGS. 6 and 7. In the illustrated embodiment, the heat sink 121 includes the base 122 of a substantially square shape. The base 122 is mounted on each of corners thereof positioned on one of diagonal lines thereof with a pillar 124. The radiation fins F1 to F60 include first sections F1a to F60a arranged so as to be opposite to a lower edge 105a of each of the blades 105 facing the base 122 and second sections F1b to F60b formed so as to positioned outside an outer side edge of the blade, so that the first and second sections of each of the fins are connected at vertical inner side surfaces thereof to each other through an upper horizontal surface of the first section, resulting in being generally formed into a staircase-like configuration in section, as shown in FIG. 7. Arrangement of the first and second sections at each of the radiation fins F1 to F60 results in a stepped recess which has a level difference formed on a side surface thereof by the above-described upper horizontal surface of the first section being defined inside the fins, in which a part of the impeller is received. In the illustrated embodiment, a lower section of the impeller is received in the stepped recess.

Now, the radiation fin F46 will be described by way of example with reference to FIGS. 6 and 7.

The radiation fin F46 is formed into a configuration which permits two virtual planes of the radiation fin defined by inwardly extending both side surfaces thereof in a longitudinal direction thereof to intersect each other in an inner space surrounded by inner ends of the first sections F1a to F60a of the radiation fins F1 to F60 and defined above the base 122 of the heat sink 121, as indicated at phantom lines in FIG. 6. It may be considered that the inner space constitutes a central region of the above-described stepped recess. More particularly, the radiation fin is formed into a shape which permits a width thereof to be gradually reduced toward an inner end thereof in a longitudinal direction thereof. Such formation of the radiation fin permits an air passage of a sufficient size or width to be defined between each adjacent two radiation fins. An excessive decrease or increase in width of the air passage leads to a deterioration in cooling efficiency. The width of the air passage is desirably determined depending on the rotational speed of the motor and the flow rate of air.

In the apparatus of the illustrated embodiment, outside dimensions of the heat sink 121, a height of the second section F46b of the radiation fin F46 and a rotational speed of the impeller 104 may be set to be 45 mm×45 mm, 6.5 mm and 5000 rpm. In this instance, the radiation fin F46 (F1, F16, F31) positioned on a central portion of one of sides of the heat sink is so arranged that an angle θ1 between a center line L1 of the radiation fin in the longitudinal direction thereof and a line L2 outwardly extending from an axis C of the motor in a direction perpendicular to the side of the heat sink is 10 degrees and an angle θ2 between both side surfaces of the radiation fin is 5 to 6 degrees. Also, the radiation fins F1 to F60 including the fin F46 are arranged in turn so that an angle θ3 between each adjacent two radiation fins is 6 degrees. Further, the radiation fins F1 to F7 and F41 to F60 other than the fins F8 to F10 and F38 to F40 positioned in correspondence to the pillars 124 are formed so as to extend to each side end of the heat sink 121.

In the illustrated embodiment, as shown in FIG. 7, the blades 105 each are formed so as to be integral with an annular hub 105A, which is then fitted on a cup-like member 106 of the impeller 104.

An electronic component cooling apparatus of the present invention which has dimensions of 45 mm×45 mm×18 mm was assembled according to the illustrated embodiment constructed as described above and then subject to a cooling performance test while placing a 10 W heating model on a heat sink 121 under conditions that a rotational speed of an impeller 104 is set to be 5000 rpm and an ambient temperature is set to be 25° C. As a result, the heating model was increased in temperature by 17° C. The illustrated embodiment causes a vertical dimension or height of the apparatus to be somewhat increased as compared with the embodiment shown in FIGS. 1 to 3. However, the former permits a rotational speed of the impeller 104 to be reduced by 1000 rpm as compared with the latter, to thereby save power consumption and minimize generation of noise.

As can be seen from the foregoing, the electronic component cooling apparatus of the present invention is constructed so as to suck in air from the side of the webs and discharge it through the air passages each defined between each adjacent two of the radiation fins. Such construction eliminates formation of any obstacle on the suction side, to thereby increase air feed efficiency, resulting in enhancing cooling performance. Also, the present invention effectively prevents the motor from being exposed to air heated by the heat sink to prevent excessive increase in temperature in the motor, to thereby improve durability of the motor.

Also, in the present invention, the blades each may be arranged so as to permit the upper edge thereof to be gradually away from the webs as it outwardly extends toward the casing. Such arrangement of the blades minimizes generation of noise due to rotation of the blades through air during suction of air from the side of the webs.

Further, when the radiation fins are arranged so as to upwardly extend from the base to a position below the upper edge of each of the blades defined on the side of the webs, suction of air from the outside of the radiation fins, particularly, the outside thereof facing the casing is minimized or substantially prevented, to thereby minimize generation of noise and restrain a deterioration in cooling efficiency.

Moreover, the present invention may be so constructed that the ribs are arranged opposite to the base of the heat sink. This permits air between the cup-like member of the impeller and the base of the heat sink to be forcibly agitated, to thereby further increase cooling performance.

Furthermore, in the present invention, the radiation fins each may be formed into a configuration which permits two virtual planes of the radiation fin defined by inwardly extending both side surfaces thereof in the longitudinal direction thereof to intersect each other in the space surrounded by the first sections of the radiation fins. Such formation of the radiation fin permits resistance of the radiation fin to an air stream fed from the side of the impeller to be reduces, to thereby increase heat radiation efficiency of the radiation fin and reduce generation of noise by the radiation fin.

Also, the casing may include the connector section provided with the plural terminals to which power required for at least driving of the motor is fed. This permits the electronic component cooling apparatus of the present invention to be connected to an electronic appliance without considering wiring codes and facilitates disconnection of the apparatus from the appliance when any failure or breakdown occurs in the apparatus.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. An electronic component cooling apparatus comprising:

a motor of the rotor out-rotation type in which a rotor is rotated outside a stator and which includes a housing;

an impeller including a plurality of blades mounted on an outer periphery of said rotor;

a casing arranged so as to surround said motor;

a plurality of webs for interconnecting said housing of said motor and said casing;

a heat sink including a base provided thereon with a plurality of radiation fins and fixed on said casing;

said radiation fins being arranged so as to surround at least a part of said impeller;

said blades of said impeller being arranged so as to draw in air from a side of said webs and while in the zone of said blades, generally change direction to move said air radially outward to pass through said radiation fins;

said blades each having an upper edge facing said webs and sloping gradually away from said webs as each of said upper edge extends in an outward direction toward said radiation fins;

said radiation fins being arranged so as to define an air passage between each adjacent two of said radiation fins for outwardly guiding air from said impeller therethrough.

2. An electronic component cooling apparatus as defined in claim 1, wherein said radiation fins each are arranged so as to vertically extend from said base of said heat sink to a position below said upper edge of each of said blades.

3. An electronic component cooling apparatus as defined in any one of claims 1 or 2, wherein said impeller includes a cup-like member having said blades mounted on an outer periphery thereof;

said cup-like member being provided at a portion thereof opposite to said base with a plurality of ribs for air agitation.

4. An electronic component cooling apparatus as defined in claim 3, wherein said ribs each are arranged so as to correspond to each of said blades and extend from a central region of said cup-like member to a lower edge of the corresponding blade.

5. An electronic component cooling apparatus as defined in claim 1, wherein said radiation fins each include a first section arranged so as to be opposite to a lower edge of each of said blades facing said base of said heat sink and a second section arranged outside said blades.

6. An electronic component cooling apparatus as defined in claim 1, wherein said radiation fins each are formed into a configuration which permits two virtual planes of each radiation fin defined by inwardly extending both side surfaces thereof defined in a longitudinal direction thereof to intersect each other in an inner space surroundedly defined by said radiation fins.

7. An electronic component cooling apparatus as defined in claim 1, wherein said base of said heat sink is formed into a contour of a substantially square shape;

said base being provided at each of corners thereof positioned on one of diagonal lines of said base with a pillar so as to be integral therewith;

said casing being threadedly mounted through said pillars on said base.

8. An electronic component cooling apparatus as defined in claim 7, wherein said radiation fins are arranged so as to extend to an outer end of said base except portions of said base at which said pillars are disposed.

9. An electronic component cooling apparatus comprising:

a motor including a rotor and a stator and received in a housing;

a cup-like impeller member having a plurality of blades mounted on an outer periphery thereof and fixed on said rotor;

a frame-like casing for fixing said rotor therein;

a plurality of webs for interconnecting said housing of said motor and said casing; and a heat sink including a base on which radiation fins each are arranged so as to substantially radially extend and terminate at an inner end thereof at an intermediate portion of said base;

said heat sink being fixed to said casing;

said radiation fins being disposed so as to permit a recess to be surroundedly defined by said inner ends of said radiation fins at a central region of said base, in which recess a part of said impeller is received;

said radiation fins being arranged so as to permit an air passage to be defined between each adjacent two of said radiation fins;

said blades being arranged so as to draw in air from a side of said webs and discharge air through said air passages of said radiation fins;

said blades each having an upper edge facing said webs and sloping gradually away from said webs as each said upper edge extends in an outward direction toward said radiation fins;

said casing including a connector section provided with a plurality of terminals to which power for driving of said motor is fed.

10. An electronic component cooling apparatus as defined in claim 9, wherein said base of said heat sink is formed into a contour of a substantially square shape;

said base being provided at each of corners thereof positioned on one of diagonal lines of said base with a pillar in a manner to be integral therewith;

said casing being threadedly mounted through said pillars on said base;

said connector section being arranged at a corner of said casing free of said pillar.

11. An electronic component cooling apparatus as defined in claim 10, wherein said casing includes a base section formed into substantially the same contour as said base of said heat sink and contacted with said radiation fins and a cylindrical section integrally mounted on said base section so as to surround a part of said impeller;

said connector section being provided at said cylindrical section.

* * * * *